United States Patent
Shikina et al.

(10) Patent No.: US 8,581,271 B2
(45) Date of Patent: Nov. 12, 2013

(54) DISPLAY APPARATUS USING SEPARATE ORGANIC ELECTROLUMINESCENT ELEMENTS IN A SINGLE PIXEL

(75) Inventors: Noriyuki Shikina, Ichihara (JP);
Kiyofumi Sakaguchi, Mobara (JP);
Nobuhiko Sato, Mobara (JP); Takashi Moriyama, Funabashi (JP)

(73) Assignee: Canon Kabushiki Kaisha, Tokyo (JP)

(*) Notice: Subject to any disclaimer, the term of this patent is extended or adjusted under 35 U.S.C. 154(b) by 157 days.

(21) Appl. No.: 13/108,546

(22) Filed: May 16, 2011

(65) Prior Publication Data

US 2011/0284881 A1    Nov. 24, 2011

(30) Foreign Application Priority Data

May 18, 2010    (WO) .................. PCT/JP2010/058366

(51) Int. Cl.
*H01L 33/00* (2010.01)
*H01L 35/24* (2006.01)
*H01L 51/00* (2006.01)
*G09G 5/00* (2006.01)
*G09G 3/12* (2006.01)
*G09G 3/30* (2006.01)

(52) U.S. Cl.
USPC .................. 257/89; 257/40; 257/88; 257/98; 257/E27.121; 345/1.1; 345/6; 345/45; 345/76; 345/77

(58) Field of Classification Search
None
See application file for complete search history.

(56) References Cited

U.S. PATENT DOCUMENTS

| | | | |
|---|---|---|---|
| 7,355,339 B2* | 4/2008 | Okinaka et al. | 313/504 |
| 7,397,443 B2* | 7/2008 | Sugiura | 345/1.1 |
| 2008/0062096 A1* | 3/2008 | Yamashita et al. | 345/82 |
| 2009/0073093 A1* | 3/2009 | Yamazaki | 345/76 |
| 2009/0096723 A1* | 4/2009 | Kawabe | 345/77 |
| 2010/0117997 A1* | 5/2010 | Haase | 345/204 |
| 2011/0050550 A1* | 3/2011 | Tsai et al. | 345/76 |
| 2013/0056768 A1* | 3/2013 | Miura | 257/89 |
| 2013/0062596 A1* | 3/2013 | Ando et al. | 257/40 |

FOREIGN PATENT DOCUMENTS

| | | |
|---|---|---|
| JP | 5-108023 A | 4/1993 |
| JP | 2004-039500 A | 2/2004 |
| JP | 2006-058710 A | 3/2006 |
| JP | 2006-302874 A | 11/2006 |
| JP | 2007-328986 A | 12/2007 |
| JP | 2008-176167 A | 7/2008 |
| JP | 2009-231274 A | 10/2009 |
| WO | 2009/104816 A1 | 8/2009 |

* cited by examiner

*Primary Examiner* — Michael Jung
(74) *Attorney, Agent, or Firm* — Canon U.S.A., Inc., IP Division

(57) ABSTRACT

At least one of the pixels has a first region and a second region that are the same in color but different in viewing angle characteristic, and includes a switching circuit configured to independently turn on or off each of the organic EL elements provided in the respective first and second regions.

9 Claims, 9 Drawing Sheets

DISPLAY APPARATUS USING SEPARATE ORGANIC ELECTROLUMINESCENT ELEMENTS IN A SINGLE PIXEL

TECHNICAL FIELD

The present invention relates to display apparatuses using organic electroluminescent (EL) elements. In particular, the present invention relates to a display apparatus capable of switching the viewing angle depending on the user's situation.

BACKGROUND ART

Japanese Patent Laid-Open No. 2004-039500 discloses a display apparatus in which, for higher efficiency in extracting light to the front, a resin microlens array is placed on a silicon nitride oxide ($SiN_xO_y$) film with which organic EL elements are sealed.

Japanese Patent Laid-Open No. 2006-302874 discloses a display apparatus in which pixels with different viewing angles are configured to simultaneously emit light, or in which each pixel is configured to have two regions with different viewing angles, the two regions being capable of simultaneously emitting light. It is thus possible to achieve a wide viewing angle while providing high front luminance.

Using a microlens array, as disclosed in Japanese Patent Laid-Open No. 2004-039500, increases luminance in the front direction, but reduces luminance in oblique directions. Such a display apparatus may not be able to provide satisfactory performance in situations where wide viewing angle characteristics are required.

This problem is not confined to organic EL elements using a microlens array, but occurs in organic EL elements having an optical interference effect.

On the other hand, with the technique disclosed in Japanese Patent Laid-Open No. 2006-302874, it is possible to achieve a wide viewing angle while providing high front luminance. However, the technique does not allow the user to select a front luminance (light extraction efficiency) priority mode or a wide viewing angle priority mode, depending on the situation.

An object of the present invention is to provide a display apparatus having organic EL elements and capable of switching between a front luminance (light extraction efficiency) priority mode (i.e., a mode having a narrow viewing angle characteristic) and a mode having a wide viewing angle characteristic, depending on the user's situation.

SUMMARY OF INVENTION

To solve the problems described above, the present invention provides the following configuration.

A display apparatus includes a plurality of information signal lines for transmitting respective information signals; a plurality of scanning signal lines for transmitting respective scanning signals; and a plurality of pixels each electrically connected to one of the information signal lines and one of the scanning signal lines, the pixels each having organic EL elements. In the display apparatus, each of the pixels includes a driving unit configured to hold the corresponding information signal and output current to the organic EL elements in accordance with the held information signal; at least one of the pixels has a first region and a second region that are the same in color but different in viewing angle characteristic; and the at least one of the pixels includes a switching circuit configured to independently turn on or off each of the organic EL elements provided in the respective first and second regions.

Further features of the present invention will become apparent from the following description of exemplary embodiments with reference to the attached drawings.

DESCRIPTION OF EMBODIMENTS

A description will now be given with reference to a display apparatus according to embodiments of the present invention.

Figure 1:
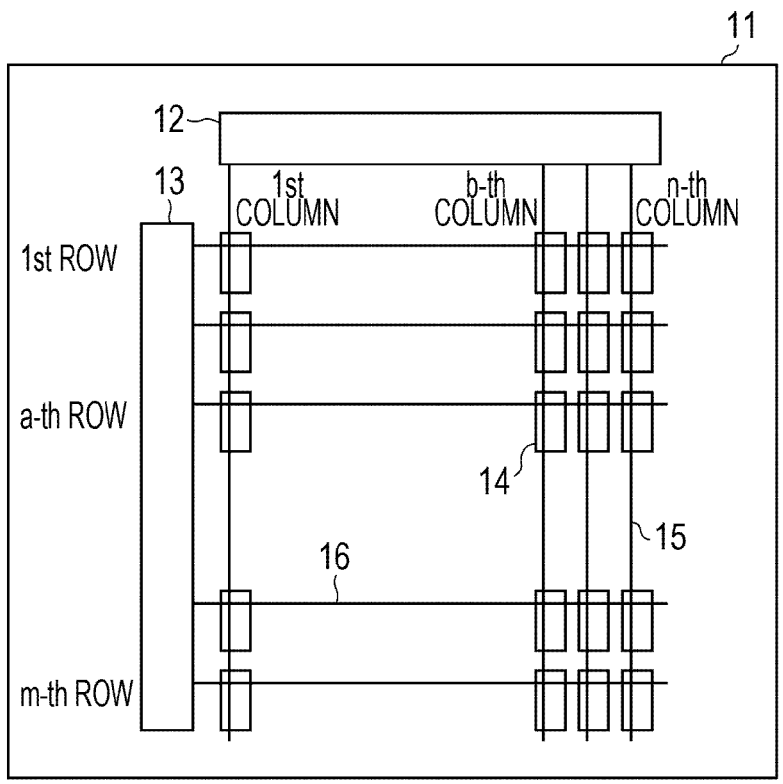
FIG. 1 is a general schematic view of an image display apparatus according to the present invention.

FIG. 1 is a schematic view of an organic EL panel 11 having m rows by n columns of pixels.

The organic EL panel 11 includes information signal lines 15 for transmitting respective information signals, and an information-signal-line driving circuit 12 that applies the information signals to the respective information signal lines 15. The organic EL panel 11 also includes scanning signal lines 16 for transmitting respective scanning signals, and a scanning-signal-line driving circuit 13 that applies the scanning signals to the respective scanning signal lines 16. The organic EL panel 11 further includes pixel circuits 14 (in the a-th row and the b-th column), each of which controls current to be passed through the pixel in accordance with the corresponding voltage applied thereto. Each of the pixel circuits 14 includes organic EL elements each having an anode electrode, an organic compound layer, and a cathode electrode.

Each pixel is located at an intersection of one information signal line 15 and one scanning signal line 16 (in the a-th row and the b-th column), and emits light in accordance with an information signal (voltage data Vdata) corresponding to the a-th row and the b-th column.

Figure 2:
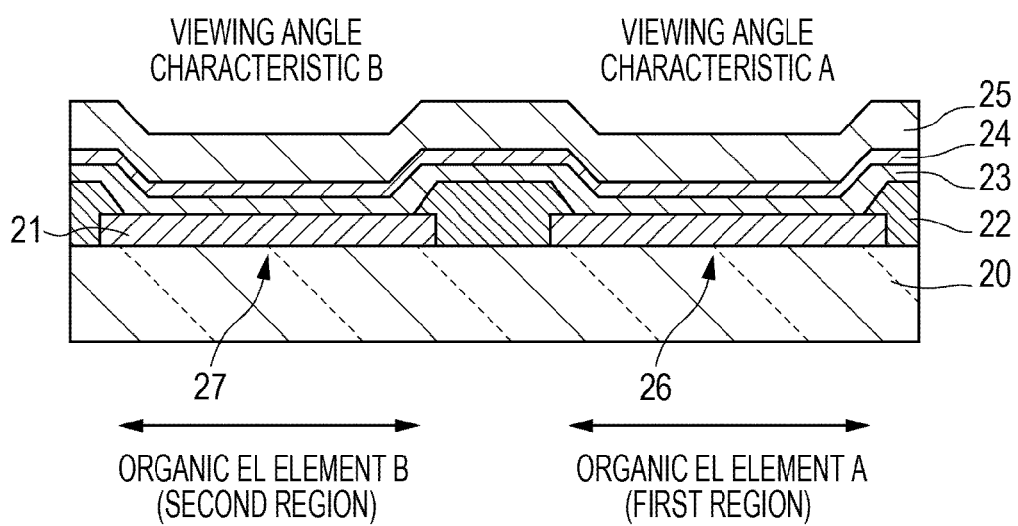
FIG. 2 is a partial cross-sectional view of organic EL elements illustrated in FIG. 1.

FIG. 2 is a partial cross-sectional view of organic EL elements in one pixel according to an embodiment of the present invention.

A description will be given using a top emission type display apparatus in which, from organic EL elements on a substrate 20, light is extracted in an upward direction (opposite the substrate).

Each pixel of this display apparatus has two regions that are the same in color but have different viewing angle characteristics (a viewing angle characteristic A and a viewing angle characteristic B).

An organic EL element A (26) and an organic EL element B (27) in the respective regions can be independently turned on or off.

The organic EL elements in the two respective regions within each pixel are provided with a separating layer that separates the regions. In addition to such a separating layer for separating two regions within each pixel, there is a separating layer for separating one pixel from another (hereinafter, these separating layers will be collectively referred to as pixel separating layers 22).

Each of the organic EL elements includes a pair of electrodes including a lower electrode (anode electrode 21) and an upper electrode (cathode electrode 24), and an organic compound layer 23 (hereinafter referred to as an organic EL layer) between the anode electrode 21 and the cathode electrode 24.

Specifically, the anode electrodes 21 formed in the respective two regions within each pixel by patterning are disposed on the substrate 20, and the organic EL layer 23 is formed on the anode electrodes 21. Additionally, the cathode electrode 24 is formed on the organic EL layer 23. The anode electrodes 21 are, for example, formed of a conductive metal material having high reflectivity, such as Ag. Alternatively, the anode electrodes 21 each may be a laminated body including a layer made of such a metal material and a layer made of a transparent conductive material having excellent hole injection characteristics, such as indium tin oxide (ITO).

The cathode electrode 24 is common to a plurality of organic EL elements. The cathode electrode 24 is configured to be semi-reflective or light transmissive so that light emitted by a light emitting layer can be extracted to the outside of the elements. Specifically, when the cathode electrode 24 is configured to be semi-reflective to provide a higher interference effect within the elements, the cathode electrode 24 is a layer having a thickness of 2 nm to 50 nm and made of a conductive metal material excellent in electron injection properties, such as Ag or AgMg.

The term "semi-reflective" means being able to partially reflect and partially transmit light emitted within the elements, and having a reflectivity of 20% to 80% for visible light. The term "light transmissive" means having a transmittance of 80% or more for visible light.

The organic EL layer 23 is composed of one or more layers including at least a light emitting layer. For example, the organic EL layer 23 may have a four-layer structure including a hole transport layer, a light emitting layer, an electron transport layer, and an electron injection layer, or may have a three-layer structure including a hole transport layer, a light emitting layer, and an electron transport layer. A known material can be used as a material of the organic EL layer 23.

The substrate 20 is provided with pixel circuits, each having a plurality of transistors and organic EL elements (not shown). The substrate 20 having the transistors is covered with an interlayer insulator (not shown), which has contact holes for electrical connection between the transistors and the anode electrodes 21. A planarizing film (not shown) that absorbs surface irregularities to planarize the surface is formed on the interlayer insulator. The organic EL elements having the anode electrodes 21, the organic EL layer 23, and the cathode electrode 24 are disposed on the planarizing film.

A protective layer 25 that protects the organic EL layer 23 from oxygen and water in the air is formed on the cathode electrode 24. The protective layer 25 is made of an inorganic material, such as SiN or SiON. Alternatively, the protective layer 25 may be a laminated film composed of an inorganic film and an organic film. The inorganic film preferably has a thickness of 0.1 μm or more and 10 μm or less, and is preferably formed by a CVD method. The organic film preferably has a thickness of 1 μm or more, as it is used to improve protective performance by covering foreign matter that has adhered to the surface during the process and cannot be removed.

Although the protective layer 25 illustrated in FIG. 2 is formed to follow the shape of the pixel separating layers 22, the protective layer 25 may have a flat surface, which can be obtained by increasing the thickness of the organic film etc.

The organic EL panel 11 of the present embodiment has pixels of three different colors, R, G, and B. The pixels of three different colors may include organic EL elements of three colors, R, G, and B, or may be formed by superimposing color filters of three colors, R, G, and B on white organic EL elements. The organic EL panel may have four colors, R, G, B, and W, instead of the three colors, R, G, and B.

Figure 3:
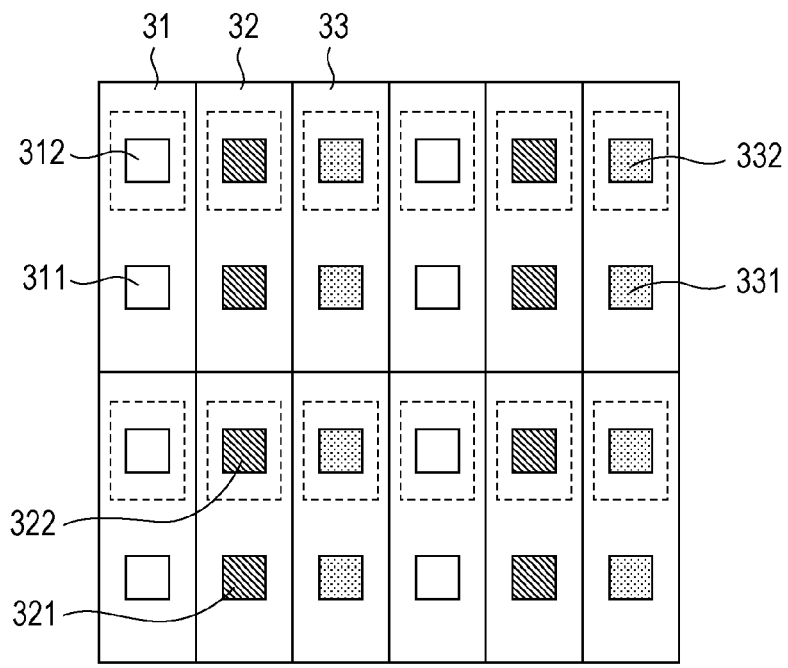
FIG. 3 illustrates a pixel arrangement according to an embodiment of the present invention.

A pixel arrangement according to an embodiment of the present invention is illustrated in FIG. 3. FIG. 3 illustrates the organic EL panel 11, as viewed from the protective layer 25 of FIG. 2.

The organic EL panel 11 includes R pixels 31, G pixels 32, and B pixels 33. Note that R, G, and B represent red, green, and blue, respectively. The same applies to the following description.

Each of the R pixels 31 has two regions, an R-1 region 311 and an R-2 region 312, which are the same in color (R) but different in viewing angle characteristic.

Similarly, each of the G pixels 32 has two regions, a G-1 region 321 and a G-2 region 322, which are the same in color (G) but different in viewing angle characteristic.

Similarly, each of the B pixels 33 has two regions, a B-1 region 331 and a B-2 region 332, which are the same in color (B) but different in viewing angle characteristic.

Hereinafter, the R-1 region 311, the G-1 region 321, and the B-1 region 331 each will be referred to as a first region, and the R-2 region 312, the G-2 region 322, and the B-2 region 332 each will be referred to as a second region.

Figure 4:
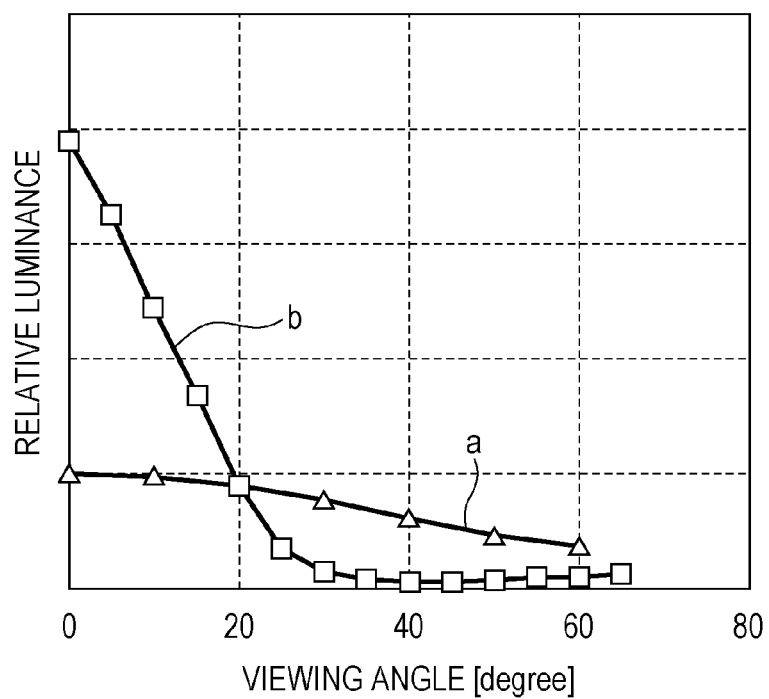
FIG. 4 illustrates luminance versus viewing angle characteristics of organic EL elements according to an embodiment of the present invention.

FIG. 4 illustrates a luminance versus viewing angle characteristic of an organic EL element B which is provided with a microlens having a light collecting effect in the R-2 region 312 of FIG. 3.

In FIG. 4, (a) represents a luminance versus viewing angle characteristic of the R-1 region 311, and (b) represents a luminance versus viewing angle characteristic of the R-2 region 312.

The vertical axis for (a) and (b) in FIG. 4 indicates a luminance value relative to a front luminance of 1 of the R-1 region 311.

As indicated by (a) in FIG. 4, the R-1 region 311 has a wide viewing angle characteristic as its optical characteristic.

In contrast, as indicated by (b) in FIG. 4, although the R-2 region 312 has a narrow viewing angle characteristic, it has an optical characteristic which provides high front luminance, i.e., high light extraction efficiency.

Similarly, an organic EL element B having a microlens in the G-2 region 322 and an organic EL element B having a microlens in the B-2 region 332 were produced. The two regions of the G pixel 32 (i.e., the G-1 region 321 and the G-2 region 322) and the two regions of the B pixel 33 (i.e., the B-1 region 331 and the B-2 region 332) exhibited luminance versus viewing angle characteristics similar to those described above.

In each of the second regions described above, the organic EL element may be configured to have an optical interference effect, instead of a microlens. The optical interference effect will be described using the following equation (1):

$$2L/\lambda + \delta/2\pi = m \qquad \text{equation (1)}$$

(where L denotes an optical distance between a light emitting region and a reflective surface of an anode electrode, $\lambda$ denotes a wavelength of extracted light, $\delta$ denotes a phase shift that occurs when light reflects, and m denotes an integer).

If equation (1) is satisfied, high light extraction efficiency can be achieved while a narrow viewing angle characteristic is exhibited, as in the cases where a microlens is used.

That is, when organic EL elements in respective first and second regions are configured such that the first region does not satisfy equation (1) and the second region satisfies equation (1), an effect similar to that in the cases where a microlens is used can be achieved.

Next, an operation of the organic EL panel 11 will be described. Although details will be described in embodiments below, the first region and the second region in each of the R, G, and B pixels are driven by a pixel circuit capable of independently turning on or off the first region and the second region.

For example, if the R-1 region 311, the G-1 region 321, and the B-1 region 331 only are turned on, the organic EL panel 11 can provide a wide viewing angle characteristic.

If the R-2 region 312, the G-2 region 322, and the B-2 region 332 only are turned on, the organic EL panel 11 exhibits a narrow viewing angle characteristic, but can achieve high efficiency in extracting light to the front.

Although only the first regions or the second regions are turned on in the example described above, it is possible to simultaneously turn on the first regions and the second regions.

Although each of the R, G, and B pixels is configured to have the first region and the second region in the example described above, the configuration is not limited to this. Each of the R pixels 31 alone may be configured to have the first region and the second region, each of the G pixels 32 alone may be configured to have the first region and the second region, or each of the B pixels 33 alone may be configured to have the first region and the second region. Alternatively, each of two different types of pixels selected from the R pixels 31, the G pixels 32, and the B pixels 33 may be configured to have the first region and the second region.

A detailed description will now be given using embodiments below.

First Embodiment

Figure 5:
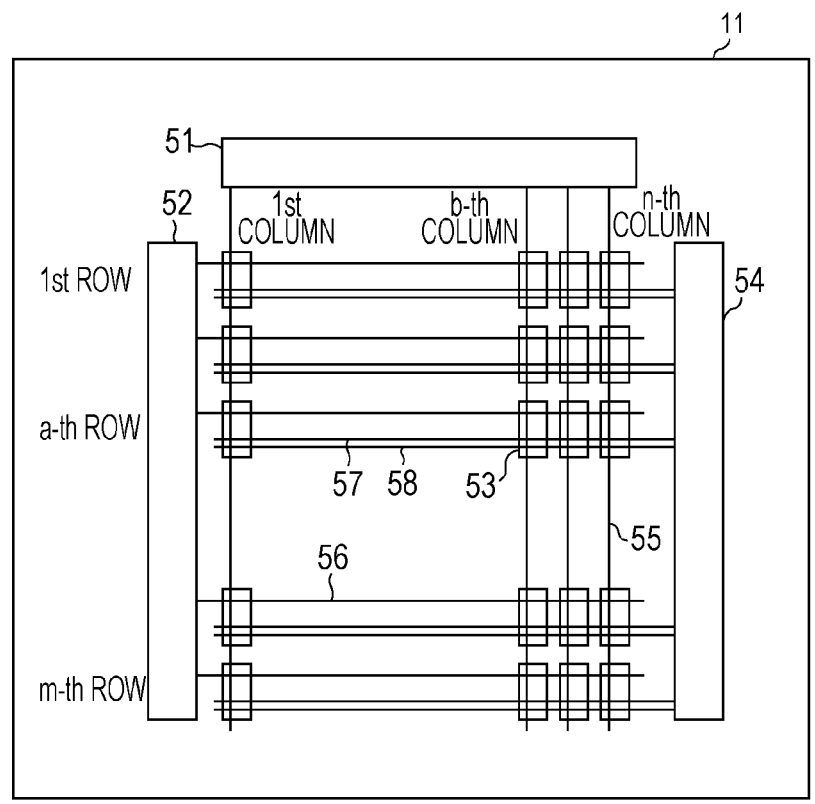
FIG. 5 is a schematic view of an organic EL panel according to a first embodiment.

FIG. 5 is a schematic view of the organic EL panel 11 having m rows by n columns of pixels.

In the present embodiment, the organic EL panel 11 includes an information-signal-line driving circuit 51 that applies voltages to respective information signal lines 55, and a scanning-signal-line driving circuit 52 that drives scanning signal lines 56. The organic EL panel 11 further includes pixel circuits 53 each controlling current to be passed through the pixel in accordance with the corresponding voltage applied thereto, a selection-control-line driving circuit 54 for selecting two light emitting regions within each pixel, and selection control lines 57 and 58 connected to respective two light emitting regions within each pixel.

Each of the pixel circuits 53 includes organic EL elements of any one of the colors R, G, and B.

Each pixel is located at an intersection of one information signal line and one scanning signal line (in the a-th row and the b-th column), and displays information in accordance with an information signal corresponding to the a-th row and the b-th column.

Figure 6:
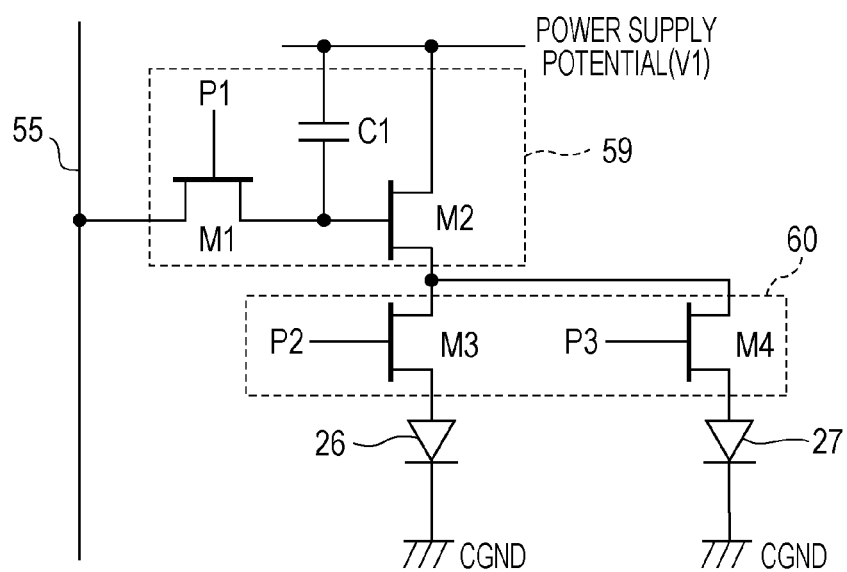
FIG. 6 illustrates a pixel circuit including organic EL elements according to the first embodiment.

Next, a configuration of the pixel circuit 53 will be described with reference to FIG. 6.

P1 denotes a scanning signal line, P2 denotes a selection control line for the organic EL element A (26), and P3 denotes a selection control line for the organic EL element B (27). As an information signal, voltage data Vdata is input from the information signal line 55 to the pixel circuit 53. The anode electrode of the organic EL element A (26) is connected to the drain electrode of a TFT (M3) which is a first switch element on the substrate, and the cathode electrode of the organic EL element A (26) is connected to a ground potential (CGND). At the same time, the anode electrode of the organic EL element B (27) is connected to the drain electrode of a TFT (M4) which is a second switch element on the substrate, and the cathode electrode of the organic EL element B (27) is connected to the ground potential (CGND). M3 and M4 constitute a switching circuit 60 for switching on and off the organic EL element A (26) and the organic EL element B (27) independently.

For example, if the pixel circuit 53 is an R pixel, the organic EL element A (26) is configured to have a "wide viewing angle characteristic" and the organic EL element B (27) is configured to have a "high front luminance (light extraction efficiency) characteristic". The same applies to a G pixel and a B pixel.

The organic EL element A (26) of "wide viewing angle characteristic" and the organic EL element B (27) of "high front luminance (light extraction efficiency) characteristic" are configured as follows.

That is, the organic EL panel 11 of the present embodiment includes the organic EL elements A (26) each being flat on the light emitting side (i.e., on the side opposite the substrate with respect to the organic EL layer), and the organic EL elements B (27) each having a microlens on the light emitting side.

Figure 7:
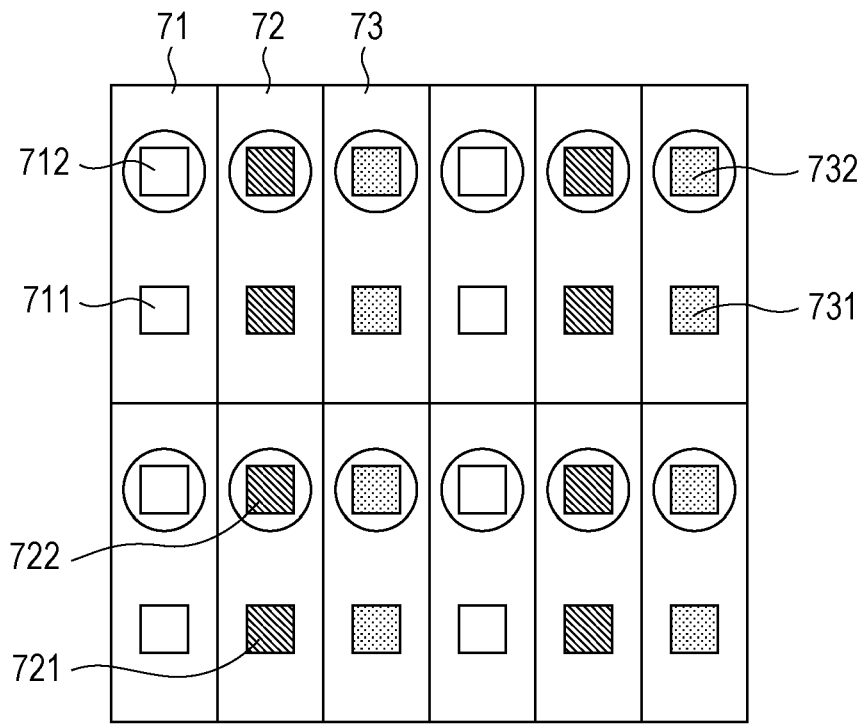
FIG. 7 illustrates a pixel arrangement according to the first embodiment.

FIG. 7 illustrates a pixel arrangement according to the present embodiment.

There are R pixels 71, G pixels 72, and B pixels 73. Each of the R pixels 71 has two regions, an R-1 region 711 and an R-2 region 712. The R-1 region 711 corresponds to the organic EL element A (26) which is flat on the light emitting side (i.e., on the side opposite the substrate with respect to the organic EL layer). The R-2 region 712 corresponds to the organic EL element B (27) having a microlens on the light emitting side. Similarly, in each of the G pixels, a G-1 region 721 corresponds to the organic EL element A (26) which is flat on the light emitting side, and a G-2 region 722 corresponds to the organic EL element B (27) having a microlens on the light emitting side. Also, in each of the B pixels, a B-1 region 731 corresponds to the organic EL element A (26) which is flat on the light emitting side, and a B-2 region 732 corresponds to the organic EL element B (27) having a microlens on the light emitting side.

Figure 8:
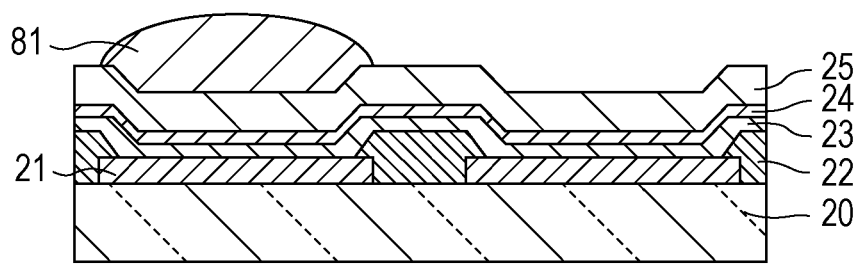
FIG. 8 is a cross-sectional view of a pixel according to the first embodiment.

FIG. 8 is a cross-sectional view of a pixel according to the present embodiment. The protective layer 25 and other layers below the protective layer 25 have the same configuration as that illustrated in FIG. 2. The organic EL element A (26) has a flat surface on the light extracting side, which is opposite the substrate 20 with respect to the organic EL layer 23.

On the other hand, the organic EL element B (27) has a microlens 81 on the light extracting side, which is opposite the substrate 20 with respect to the organic EL layer 23. The microlens 81 is formed by processing a resin member. Specifically, microlenses can be formed by embossing. Any of the following methods (i) to (v) can be used to produce microlenses:

(i) A resin layer patterned by photolithography is heat-treated and formed into a microlens shape by a reflow process;

(ii) A photocurable resin layer formed to a uniform thickness is exposed to light distributed in an in-plane direction, and is developed to form microlenses;

(iii) A surface of a resin member formed to a uniform thickness using an ion beam, an electron beam, or a laser beam is processed into a microlens shape;

(iv) An appropriate amount of resin dropped into each pixel is formed into a microlens in a self-aligned manner; and (v) In addition to a substrate having organic EL elements thereon, a resin sheet having microlenses formed in advance is prepared, and aligned with and bonded to the substrate.

Figure 9:
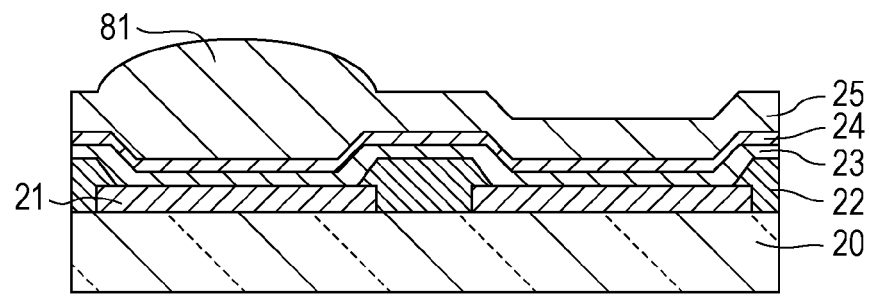
FIG. 9 is a cross-sectional view of a pixel according to the first embodiment.

If the protective layer 25 is composed of multiple layers and an organic resin is used in part of the layers, the resin may be processed into a lens shape. The resulting cross-sectional configuration is illustrated in FIG. 9. When the resin is used as described above, it is possible to planarize a surface. As illustrated in FIG. 9, a region without a lens can be planarized easily. With this configuration, in the organic EL element B (27) having the microlens 81, light emitted from the organic EL layer 23 passes through the cathode electrode 24 which is transparent. The light further passes through the protective layer 25 and the microlens 81, and is emitted outside the organic EL element. In the configuration with the microlens 81, as compared to that without the microlens 81, the emission angle is closer to a direction perpendicular to the substrate. Thus, with the microlens 81, a light collecting effect in the direction perpendicular to the substrate is improved. This means that the display apparatus can make more efficient use of light in the front direction.

Also, in the configuration with the microlens 81, an incident angle of light incident to an emission interface, the light being obliquely emitted from the light emitting layer, is close to a right angle. Therefore, the amount of total reflection of light is reduced, and the light extraction efficiency is increased.

On the other hand, in the organic EL element A (26) with no microlens, light obliquely emitted from the light emitting layer of the organic EL layer 23 is emitted more obliquely from the protective layer 25, depending on the difference in refractive index between air and the protective layer 25.

Although the protective layer 25 illustrated in FIG. 8 is formed to follow the shape of the pixel separating layers 22, the protective layer 25 may have a flat surface. By using an organic material, it is possible to easily planarize the surface of the protective layer 25.

Referring back to FIG. 6, an operation of the pixel circuit 53 will be described.

M1 (switching element), M3 (first switch element), and M4 (second switch element) to be described are of nMOS type. If they are of pMOS type, it is necessary to reverse High and Low levels.

When a High-level signal is input to the scanning signal line P1, an information signal is transmitted to M1 (i.e., Vdata is input to M1). At the same time, Low-level signals are input to M2 and M3. Then, M1 is turned ON, and M3 and M4 constituting the switching circuit are turned OFF.

Since M3 and M4 constituting the switching circuit 60 are not in a conductive state, no current flows through the organic EL element A (26) and the organic EL element B (27). In accordance with Vdata, a voltage corresponding to the current driving capability of M1 is held by C1 (capacitor) placed between the gate electrode of M2 (current output transistor) and a power supply potential V1. Although C1 is connected to the power supply potential V1, C1 may be connected to a first electrode of M2 adjacent to the power supply potential. Then, current is output to M3 and M4, through a second electrode of M2 electrically connected to M3 and M4.

A section constituted by M1 (switching element), C1 (capacitor), and M2 (current output transistor) is referred to as a driving unit 59.

When current is to be supplied only to the organic EL element A (26) in accordance with Vdata written, a Low-level signal is input to P1, a High-level signal is input to P2, and a Low-level signal is input to P3. Then, the transistor M1 is turned OFF, M3 is turned ON, and M4 is turned OFF. Since M3 is in a conductive state, a voltage generated in C1 causes current corresponding to the current driving capability of M2 to be supplied to the organic EL element A (26). Thus, only the organic EL element A (26) emits light at luminance corresponding to the supplied current.

Conversely, when current is to be supplied only to the organic EL element B (27), a Low-level signal is input to P1, a Low-level signal is input to P2, and a High-level signal is input to P3. Then, the transistor M1 is turned OFF, M3 is turned OFF, and M4 is turned ON. Since M4 is in a conductive state, a voltage generated in C1 causes current corresponding to the current driving capability of M2 to be supplied only to the organic EL element B (27). Thus, only the organic EL element B (27) emits light at luminance corresponding to the supplied current.

That is, the above-described operation reveals that the driving unit 59 is configured to hold an information signal and output current in accordance with the information signal held.

Thus, current is controlled by M2 which is controlled in accordance with the information signal corresponding to the a-th row and the b-th column, and current based on the same information signal is supplied to the organic EL element A (26) and the organic EL element B (27) of the pixel in the a-th row and the b-th column.

By switching between High and Low levels of P2 and P3, the organic EL element A (26) and the organic EL element B (27) can be controlled independently.

Therefore, it is possible to control the organic EL panel 11 by selecting one of "wide viewing angle characteristic" and "front luminance (light extraction efficiency) priority characteristic".

Second Embodiment

In the first embodiment described above, M2 (current output transistor) in the pixel circuit 53 is shared by the organic EL element A (26) and the organic EL element B (27). In this case, if there is a significant difference in light extraction efficiency between the organic EL element A (26) and the organic EL element B (27), it is necessary to expand the dynamic range of current supply of the transistor M1. This may cause degradation in image quality of the organic EL panel.

To solve such a problem, the present embodiment deals with the case where the organic EL element A (26) and the organic EL element B (27) use different transistors, M2 (first current-output transistor) and M5 (second current-output transistor), respectively.

A schematic view of the organic EL panel according to the present embodiment is the same as that in the first embodiment. The configuration of the second embodiment will not be described, as it is the same as that of the first embodiment unless otherwise stated.

Figure 10:
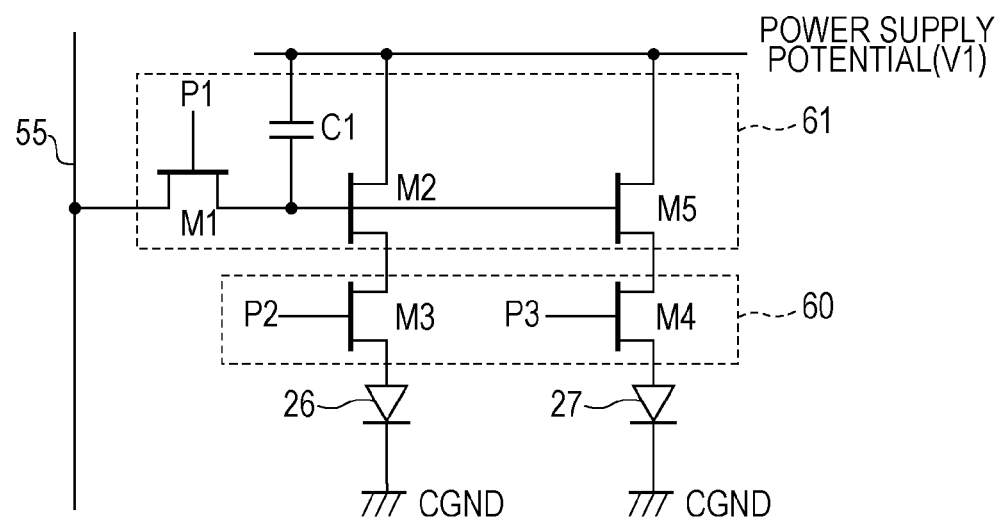
FIG. 10 illustrates a pixel circuit including organic EL elements according to a second embodiment.

FIG. 10 illustrates a configuration of the pixel circuit 53 including organic EL elements according to the present embodiment.

P1 denotes a scanning signal line 56, P2 denotes a selection control line 57 for the organic EL element A (26), and P3 denotes a selection control line 58 for the organic EL element B (27). As an information signal, voltage data Vdata is input from the information signal line 55 to the pixel circuit 53. The anode electrode 21 of the organic EL element A (26) is connected to the drain electrode of the TFT (M3) which is a first switch element, and the cathode electrode 24 of the organic EL element A (26) is connected to the ground potential (CGND). The anode electrode of the organic EL element B (27) is connected to the drain electrode of the TFT (M4) which is a second switch element, and the cathode electrode of the organic EL element B (27) is connected to the ground potential (CGND). The drain electrode of M2 (first current-output transistor) is connected to the source electrode of M3 (first switch element). The drain electrode of M5 (second current-output transistor) is connected to the source electrode of M4 (second switch element).

For example, if the pixel circuit 53 is an R pixel, the organic EL element A (26) is formed as an R element of "wide viewing angle characteristic" and the organic EL element B (27) is formed as an R element of "high front luminance (light extraction efficiency) characteristic". The same applies to a G pixel and a B pixel.

Since the organic EL element B (27) has light extraction efficiency higher than that of the organic EL element A (26), the amount of current to be supplied to the organic EL element B (27) can be reduced. Therefore, M5 can be laid out such that its current supply capability for voltage can be smaller than that of M2.

The structure and arrangement of the organic EL element A (26) and the organic EL element B (27) will not be described here, as they are the same as those in the first embodiment.

An operation of the pixel circuit 53 will now be described with reference to FIG. 10.

When an information signal is written (i.e., Vdata is input), a High-level signal is input to the scanning signal line P1, Low-level signals are input to M2 and M3, the transistor M1 (switching element) is turned ON, and M3 and M4 are turned OFF. Since M3 and M4 constituting the switching circuit are not in a conductive state, no current flows through the organic EL element A (26) and the organic EL element B (27). In accordance with Vdata, a voltage corresponding to the current driving capability of M1 (switching element) is held by C1 (capacitor) placed between the gate electrodes of M2 and M5 and the power supply potential V1.

A section constituted by M1 (switching element), M2 (first current-output transistor), M5 (second current-output transistor), and C1 (capacitor) is referred to as a driving unit 61.

Next, when current is to be supplied to the organic EL element A (26) in accordance with Vdata written, a Low-level signal is input to P1, a High-level signal is input to P2, and a Low-level signal is input to P3. Then, the transistor M1 is turned OFF, M3 is turned ON, and M4 is turned OFF. Since M3 is in a conductive state, a voltage generated in C1 causes current corresponding to the current driving capability of M2 to be supplied to the organic EL element A (26). Thus, the organic EL element A (26) emits light at luminance corresponding to the supplied current.

Conversely, when current is to be supplied to the organic EL element B (27), a Low-level signal is input to P1, a Low-level signal is input to P2, and a High-level signal is input to P3. Then, the transistor M1 is turned OFF, M2 is turned OFF, and M5 is turned ON. Since M4 is in a conductive state, a voltage generated in C1 causes current corresponding to the current driving capability of M5 to be supplied to the organic EL element B (27). Thus, the organic EL element B (27) emits light at luminance corresponding to the supplied current. Since the current driving capability of M5 is smaller than that of M2, the amount of current flowing through the organic EL element B (27) is smaller than that of current flowing through the organic EL element A (26).

That is, the above-described operation reveals that the driving unit 61 is configured to hold an information signal and output current in accordance with the information signal held.

By switching between High and Low levels of P2 and P3 as described above, the organic EL element A (26) and the organic EL element B (27) can be controlled independently. Therefore, it is possible to control the organic EL panel 11 by selecting one of "wide viewing angle characteristic" and "front luminance (light extraction efficiency) priority characteristic".

Moreover, the organic EL element A (26) and the organic EL element B (27) can be supplied with current from different transistors. This means that it is possible to use a transistor appropriate for the amount of current necessary for each of the organic EL element A (26) and the organic EL element B (27).

Third Embodiment

In the first embodiment, the pixel circuit 53 includes the transistors M3 and M4 for switching ON and OFF the supply of current to the organic EL element A (26) and the organic EL element B (27), respectively. Since a large number of transistors are required in this case, many constraints are placed on the pixel layout.

The present embodiment deals with the case where the number of transistors in the pixel circuit 53 is reduced by removing the switching elements M3 and M4 and modifying the power supply wiring. The configuration of the third embodiment is the same as that of the first embodiment unless otherwise stated.

Figure 11:
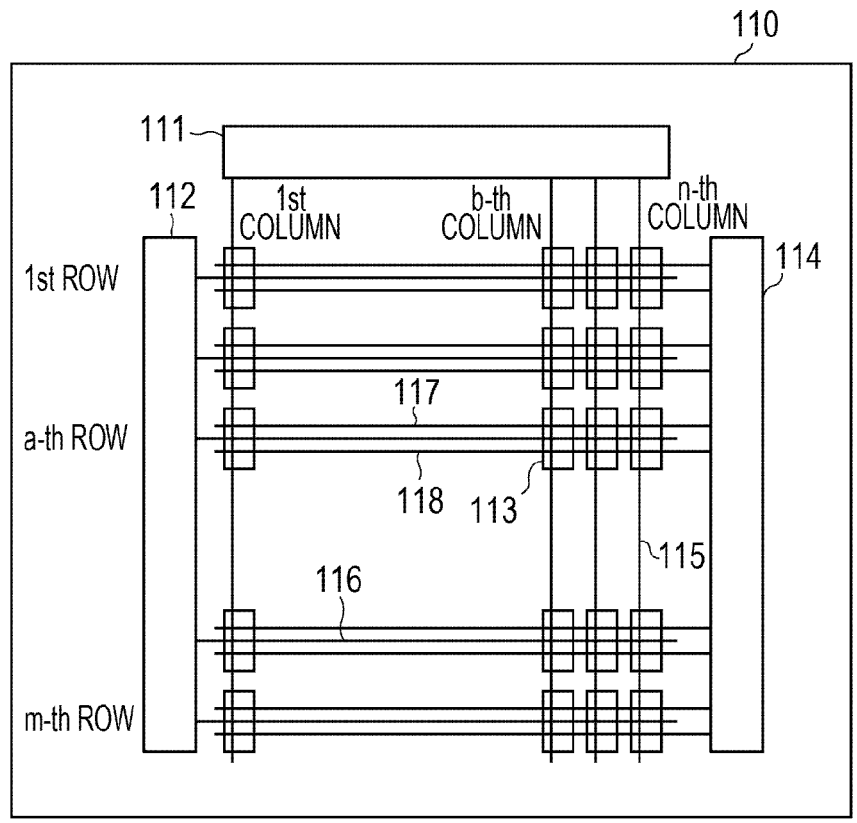
FIG. 11 is a schematic view of an organic EL panel according to a third embodiment.

FIG. 11 is a schematic view of an organic EL panel according to the present embodiment.

In the present embodiment, an organic EL panel 110 includes an information-signal-line driving circuit 111 that applies voltages to respective information signal lines 115, and a scanning-signal-line driving circuit 112 that drives scanning signal lines 116. The organic EL panel 110 further includes a selection-control-line driving circuit 114 for cathode electrodes, and selection control lines 117 and 118 for respective sets of two cathode electrodes. Each of pixel circuits 113 includes organic EL elements of any one of the colors R, G, and B.

Each pixel is located at an intersection of one information signal line and one scanning signal line (in the a-th row and the b-th column), and displays information in accordance with an information signal (voltage data Vdata) corresponding to the a-th row and the b-th column.

Figure 12:
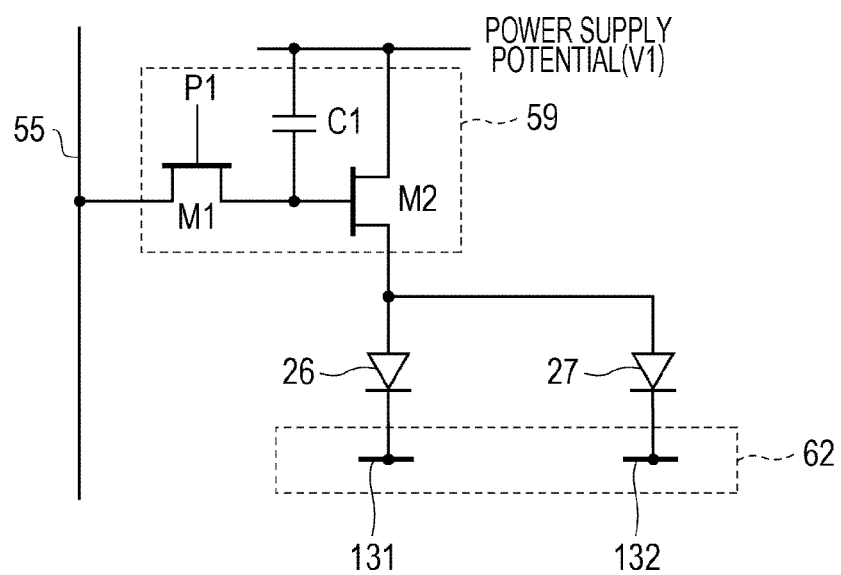
FIG. 12 illustrates a configuration of a circuit including organic EL elements according to the third embodiment.

FIG. 12 illustrates a configuration of a circuit including organic EL elements according to the present embodiment.

There is the driving unit 59 that controls current to be passed through the pixel in accordance with the corresponding voltage applied thereto. The driving unit 59 includes M1 (switching element), M2 (current output transistor), and C1 (capacitor).

P1 connected to M1 is a scanning signal line. As an information signal, voltage data Vdata is input from the information signal line to M1. The anode electrode of the organic EL element A (26) is connected to the drain electrode of M2 (current output transistor), and the cathode electrode of the organic EL element A (26) is connected to a power supply-A 131 which is a first power supply. The anode electrode of the organic EL element B (27) is connected to the drain electrode of M2, and the cathode electrode of the organic EL element B (27) is connected to a power supply-B 132 which is a second power supply.

As in the case of the first embodiment, the organic EL element A (26) is flat on the light emitting side (i.e., on the side opposite the substrate with respect to the organic EL layer), and the organic EL element B (27) has a microlens on the light emitting side.

Figure 13:
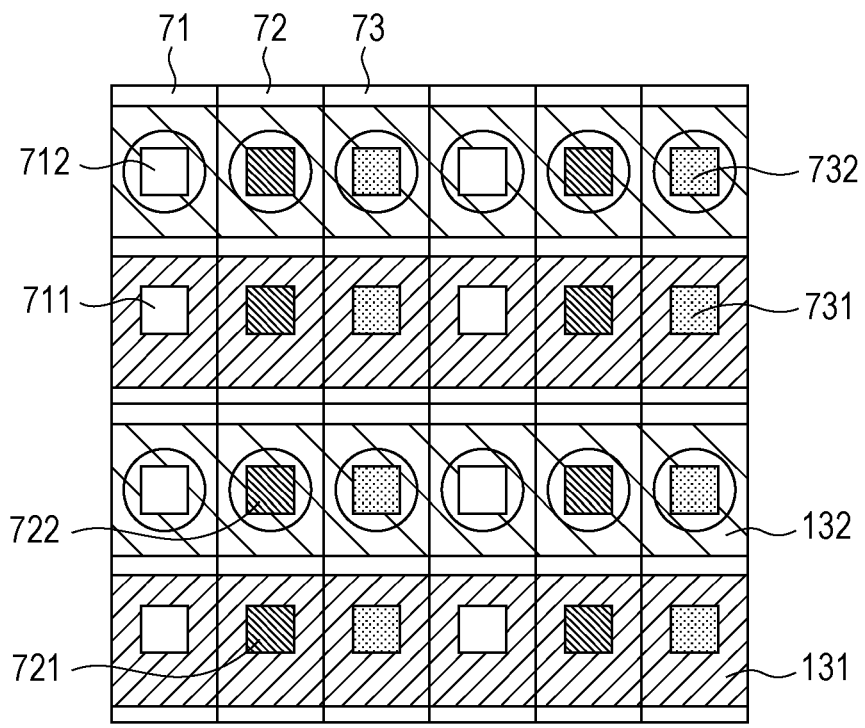
FIG. 13 illustrates a pixel arrangement according to the third embodiment.

FIG. 13 illustrates a pixel arrangement according to the present embodiment.

As in the case of FIG. 7 of the first embodiment, there are R pixels 71, G pixels 72, and B pixels 73. The organic EL element A (26) and the organic EL element B (27) of each of R, G, and B are also the same as those illustrated in FIG. 7 of the first embodiment. In the organic EL element A (26), the cathode electrode is connected to the power supply-A 131. In the organic EL element B (27), the cathode electrode is connected to the power supply-B 132.

Figure 14:
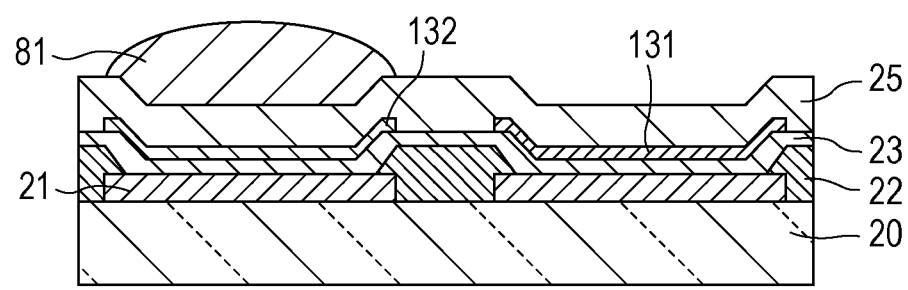
FIG. 14 is a cross-sectional view of a pixel according to the third embodiment.

FIG. 14 is a cross-sectional view of a pixel according to the present embodiment.

The illustrated pixel is the same as that illustrated by the cross-sectional view of FIG. 8 of the first embodiment, except that the cathode electrode is divided into the power supply-A 131 and the power supply-B 132.

An operation in the present embodiment will now be described using FIG. 12.

When an information signal is written (i.e., Vdata is input), a High-level signal is input to the scanning signal line P1 and the transistor M1 is turned ON. In accordance with Vdata, a voltage corresponding to the current driving capability of M1 is held by C1 (capacitor) placed between the gate electrode of M2 and the power supply potential V1.

Next, when current is to be supplied to the organic EL element A (26) in accordance with Vdata written, the power supply-A 131 is set to the GND potential. A Low-level signal is input to P1, and the transistor M1 is turned OFF. A voltage generated in C1 causes current corresponding to the current driving capability of M2 to be supplied to the organic EL element A (26). Thus, the organic EL element A (26) emits light at luminance corresponding to the supplied current.

At the same time, the power supply-B 132 is set to the potential V1. Thus, since no potential difference is produced between the cathode and the anode of the organic EL element B (27), no current flows through the organic EL element B (27), which therefore does not emit light.

Conversely, when current is to be supplied to the organic EL element B (27), the power supply-B 132 is set to the GND potential. A Low-level signal is input to P1, and the transistor M1 is turned OFF. A voltage generated in C1 causes current corresponding to the current driving capability of M2 to be supplied to the organic EL element B (27). Thus, the organic EL element B (27) emits light at luminance corresponding to the supplied current.

At the same time, the power supply-A 131 is set to the potential V1. Thus, since no potential difference is produced between the cathode and the anode of the organic EL element A (26), no current flows through the organic EL element A (26), which therefore does not emit light.

As described above, the power supply-A 131 and the power supply-B 132 function as a switching circuit 62. In other words, by switching the potentials of the power supply-A 131 and the power supply-B 132, the organic EL element A (26) and the organic EL element B (27) can be controlled independently. Therefore, it is possible to control the organic EL panel 110 by selecting one of "wide viewing angle characteristic" and "front luminance (light extraction efficiency) priority characteristic".

Moreover, since the number of transistors can be reduced as compared to that in the first embodiment, constraints on the circuit layout can be reduced.

Fourth Embodiment

Referring to FIG. 10 of the second embodiment, the pixel circuit 53 includes the first current-output transistor M2 and the second current-output transistor M5 for switching ON and OFF the supply of current to the organic EL element A (26) and the organic EL element B (27), respectively. The pixel circuit 53 also includes the transistor M3 (first switch element) for applying current to the organic EL element A (26), and M4 (second switch element) for applying current to the organic EL element B (27). Since a large number of transistors are required in this case, many constraints are placed on the pixel layout.

Therefore, as in the case of the third embodiment, the fourth embodiment deals with the case where the number of transistors in the pixel circuit 53 is reduced by removing the switching elements M3 and M4 and modifying the power supply wiring. The configuration of the fourth embodiment is the same as that of the second embodiment unless otherwise stated.

The schematic view of the organic EL panel according to the present embodiment is the same as that of FIG. 11 of the third embodiment.

Figure 15:
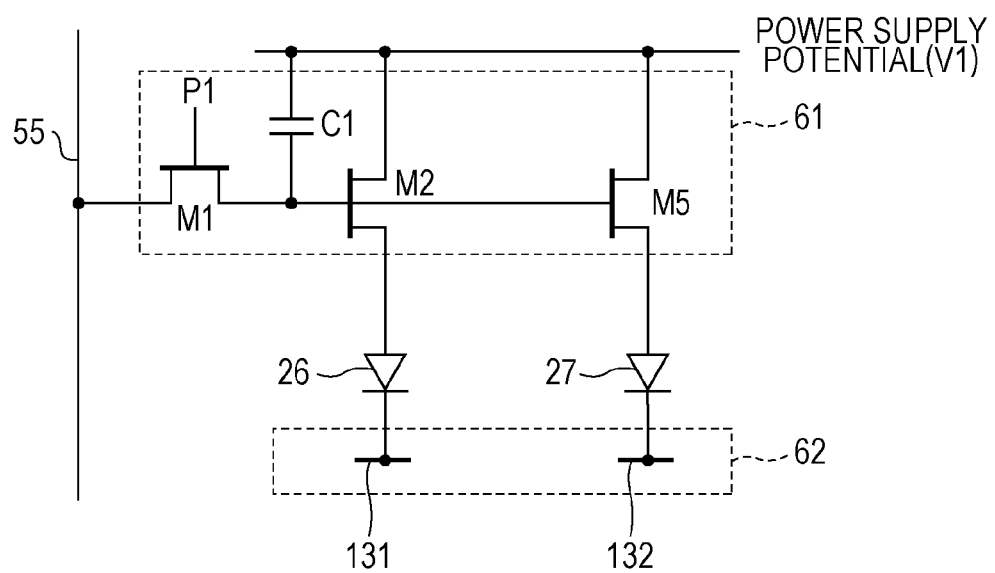
FIG. 15 illustrates a configuration of a circuit including organic EL elements according to a fourth embodiment.

FIG. 15 illustrates a configuration of a circuit including organic EL elements according to the present embodiment. P1 denotes a scanning signal line. As an information signal, voltage data Vdata is input from the information signal line to the driving unit 61. The anode electrode of the organic EL element A (26) is connected to the drain electrode of M2, and the cathode electrode of the organic EL element A (26) is connected to the power supply-A 131 which is a first power supply. The anode electrode of the organic EL element B (27) is connected to the drain electrode of the TFT (M5), and the cathode electrode of the organic EL element B (27) is connected to the power supply-B 132 which is a second power supply.

As in the case of the third embodiment, the organic EL element A (26) is flat on the light emitting side (i.e., on the side opposite the substrate with respect to the organic EL layer), and the organic EL element B (27) has a microlens on the light emitting side.

Since the organic EL element B (27) has light extraction efficiency higher than that of the organic EL element A (26), the amount of current to be supplied to the organic EL element B (27) can be reduced. Therefore, M5 can be laid out such that its current supply capability for signal voltage can be smaller than that of M2. Note that the pixel arrangement and the cross-sectional structure of the pixel of the present embodiment are the same as those of the third embodiment.

Next, an operation will be described using FIG. 15.

When an information signal is written (i.e., Vdata is input), a High-level signal is input to the scanning signal line P1, and M1 (switching element) is turned ON. In accordance with Vdata, a voltage corresponding to the current driving capability of M1 is held by C1 (capacitor) placed between the gate electrodes of M2 (first current-output transistor) and M5 (second current-output transistor) and the power supply potential V1. A section constituted by M1 (switching element), M2 (first current-output transistor), M5 (second current-output transistor), and C1 (capacitor) is referred to as the driving unit 61.

Next, when current is to be supplied to the organic EL element A (26) in accordance with Vdata written, the power supply-A 131 is set to the GND potential. A Low-level signal is input to P1, and the transistor M1 is turned OFF. A voltage generated in C1 causes current corresponding to the current driving capability of M2 to be supplied to the organic EL element A (26). Thus, the organic EL element A (26) emits light at luminance corresponding to the supplied current. On the other hand, the power supply-B 132 is at the same voltage level as the power supply potential V1. Thus, since no potential difference is produced between the cathode and the anode of the organic EL element B (27), no current flows through the organic EL element B (27), which therefore does not emit light.

Conversely, when current is to be supplied to the organic EL element B (27), the power supply-B 132 is set to the GND potential. A Low-level signal is input to P1, and the transistor M1 is turned OFF. A voltage generated in C1 causes current corresponding to the current driving capability of M5 to be supplied to the organic EL element B (27). Thus, the organic EL element B (27) emits light at luminance corresponding to the supplied current. At the same time, the power supply-A 131 is set to the potential V1. Thus, since no potential difference is produced between the cathode and the anode of the organic EL element A (26), no current flows through the organic EL element A (26), which therefore does not emit light.

As described above, the emission of light from the organic EL element A (26) and the organic EL element B (27) of the pixel in the a-th row and the b-th column is controlled by current that flows through M2 and M5 in accordance with the information signal corresponding to the a-th row and the b-th column.

That is, the above-described operation reveals that the driving unit is configured to hold an information signal and output current in accordance with the information signal held.

By switching the potentials of the power supply-A 131 and the power supply-B 132 which function as the switching circuit 62, the organic EL element A (26) and the organic EL element B (27) can be controlled independently. Therefore, it is possible to control the organic EL panel 110 by selecting one of "wide viewing angle characteristic" and "front luminance (light extraction efficiency) priority characteristic".

Moreover, since the number of transistors can be reduced as compared to that in the second embodiment, constraints on the circuit layout can be reduced.

Additionally, as in the case of the second embodiment, the organic EL element A (26) and the organic EL element B (27) can be supplied with current from different transistors. This means that it is possible to use a transistor appropriate for the amount of current necessary for each of the organic EL element A (26) and the organic EL element B (27).

Fifth Embodiment

As an organic EL element of "front luminance (light extraction efficiency) priority characteristic", the first embodiment has described an element having a microlens. However, the organic EL element is not limited to this.

As organic EL elements having different optical characteristics, the present embodiment describes organic EL elements that are different in interference condition.

A schematic view of an organic EL panel, a circuit configuration, and a circuit operation in the present embodiment are the same as those in the first embodiment. In the present embodiment, as in the case of the first embodiment, each pixel includes the organic EL element A (26) of "wide viewing angle characteristic" and the organic EL element B (27) of "front luminance (light extraction efficiency) priority characteristic". The pixel arrangement is the same as that in the first embodiment.

Figure 16:
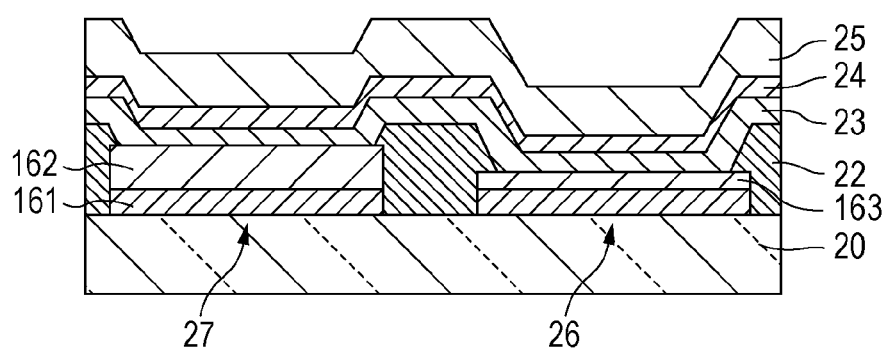
FIG. 16 is a cross-sectional view of a pixel according to a fifth embodiment.

FIG. 16 is a partial cross-sectional view of organic EL elements according to the present embodiment. These organic EL elements are the same as those illustrated by the partial cross-sectional view of FIG. 2, except for the anode electrodes 21. A detailed description will now be given of anode electrodes. On the substrate 20, reflective metal layers 161 are formed for the respective organic EL elements by patterning. For example, the reflective metal layers 161 are formed of a conductive metal material having high reflectivity, such as Ag. An anode electrode 162 and an anode electrode 163 having different thicknesses are formed on the respective reflective metal layers 161. The anode electrodes 162 and 163 are formed of a transparent conductive material having excellent hole injection characteristics, such as ITO or IZO. Each of the layers over the anode electrodes 162 and 163 is formed to a uniform thickness. By forming each of the layers as described above, it is possible to produce the organic EL element A (26) and the organic EL element B (27) that are different in optical interference condition.

As a specific example, Table 1 shows a thickness of each layer of the organic EL element A (26) and the organic EL element B (27) of R.

TABLE 1

| | Red | |
| --- | --- | --- |
| | Organic EL Element A | Organic EL Element B |
| ITO | | 50 nm |
| Ag | | 12 nm |
| Electron Injection Layer | | 28 nm |
| Electron Transport Layer | | 20 nm |
| Light Emitting Layer | | 30 nm |
| Hole Transport Layer | | 253 nm |
| IZO | 10 nm | 125 nm |
| Ag | 500 nm | |

Figure 17:
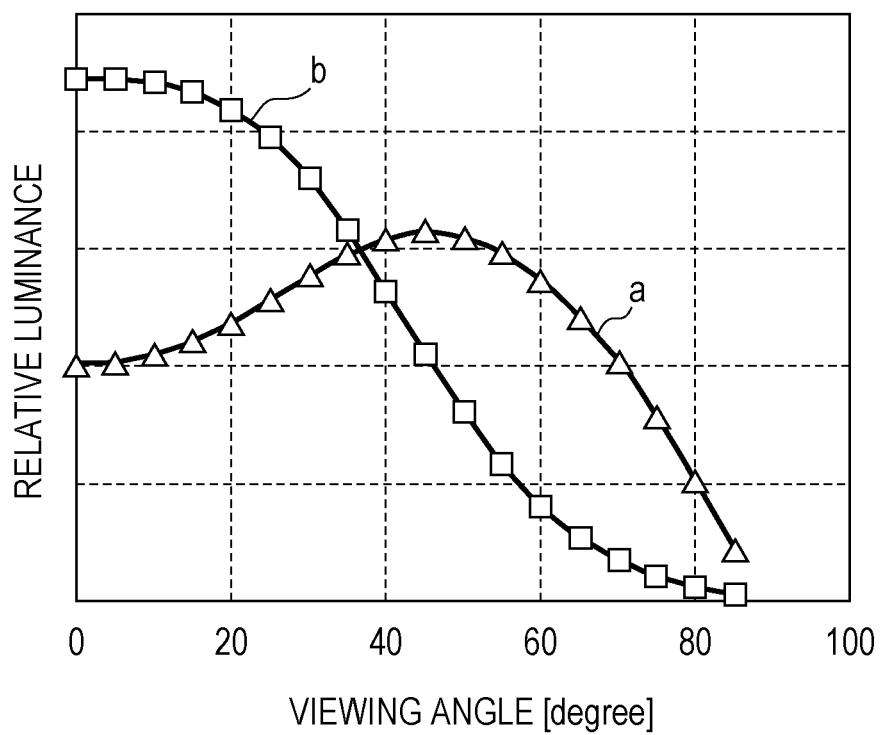
FIG. 17 illustrates luminance versus viewing angle characteristics of organic EL elements according to the fifth embodiment.

FIG. 17 illustrates luminance versus viewing angle characteristics in this example. In FIG. 17, (a) represents a luminance versus viewing angle characteristic of the organic EL element A (26) of R, and (b) represents a luminance versus viewing angle characteristic of the organic EL element B (27) of R. Each of (a) and (b) in FIG. 17 represents a luminance value relative to a front luminance of 1 of the organic EL element A (26). As indicated by (a) in FIG. 17, the organic EL element A (26) has a wide viewing angle characteristic as its optical characteristic. As indicated by (b) in FIG. 17, although the organic EL element B (27) has a narrow viewing angle characteristic, it has an optical characteristic which provides high front luminance, i.e., high light extraction efficiency.

The front chromaticity (CIEx, CIEy) of the organic EL element A (26) was (0.69, 0.31), and the front chromaticity (CIEx, CIEy) of the organic EL element B (27) was (0.67, 0.33).

Although organic EL elements of R have been described above, similar characteristics were able to be obtained for organic EL elements of G and B by adjusting the thicknesses of anode electrodes.

An operation of a pixel circuit according to the present embodiment is the same as that in the first embodiment.

Therefore, when an organic EL panel including organic EL elements that are different in optical interference condition is used, it is possible to control the organic EL panel by selecting one of "wide viewing angle characteristic" and "front luminance (light extraction efficiency) priority characteristic".

Sixth Embodiment

A schematic view of an organic EL panel, a circuit configuration, and a circuit operation in the present embodiment are the same as those in the second embodiment.

In the present embodiment, as in the case of the fifth embodiment, the organic EL element A (26) of "wide viewing angle characteristic" and the organic EL element B (27) of "front luminance (light extraction efficiency) priority characteristic" are different in optical interference condition.

With the above-described configuration which uses the organic EL element A (26) and the organic EL element B (27) that are different in optical interference condition, it is possible to achieve an effect similar to that of the second embodiment.

Seventh Embodiment

A schematic view of an organic EL panel, a circuit configuration, and a circuit operation in the present embodiment are the same as those in the third embodiment.

In the present embodiment, as in the case of the fifth embodiment, the organic EL element A (26) of "wide viewing angle characteristic" and the organic EL element B (27) of "front luminance (light extraction efficiency) priority characteristic" are different in optical interference condition.

With the above-described configuration which uses the organic EL element A (26) and the organic EL element B (27) that are different in optical interference condition, it is possible to achieve an effect similar to that of the third embodiment.

Eighth Embodiment

A schematic view of an organic EL panel, a circuit configuration, and a circuit operation in the present embodiment are the same as those in the fourth embodiment.

In the present embodiment, as in the case of the fifth embodiment, the organic EL element A (26) of "wide viewing angle characteristic" and the organic EL element B (27) of "front luminance (light extraction efficiency) priority characteristic" are different in optical interference condition.

With the above-described configuration which uses the organic EL element A (26) and the organic EL element B (27) that are different in optical interference condition, it is possible to achieve an effect similar to that of the fourth embodiment.

With the configuration of the present invention described above, it is possible to provide a display apparatus using organic EL elements and capable of switching between a mode having high front luminance (light extraction efficiency) and a mode having a wide viewing angle characteristic, depending on the user's situation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2010/058366, filed May 18, 2010, which is hereby incorporated by reference herein in its entirety.

Industrial Applicability

The present invention is applicable to display apparatuses using organic EL elements.

The invention claimed is:

1. A display apparatus comprising:
    a first organic EL element and a second organic EL element respectively arranged in a first region and a second region that are same in color;
    a light collecting lens arranged in the second region and not arranged in the first region;
    at least one of current output transistors for applying current to the first organic EL element and the second organic EL element;
    a capacitor connected to at least one of the current output transistor;
    a first switch element connected between the at least one of current output transistor and the first organic EL element;
    a second switch element connected between the current output transistor and the second organic EL element;
    a first selection control line switching ON/OFF of the first element, and
    a second selection control line switching ON/OFF of the second switch element, being different from the first selection control line.

2. The display apparatus according to claim 1, wherein the at least one of current output transistor includes a first current output transistor to apply current to the first organic EL element and a second current output transistor to apply current to the second organic EL element, and the first switch element is connected between the first current output transistor and the first organic EL element, and the second switch element is connected between the second current output transistor and the second organic EL element.

3. The display apparatus according to claim 2, wherein a front luminance of the second region is higher than a front luminance of the first region, and a current supply capability of the first current output transistor and a current supply capability of the second current output transistor are different with each other so that an amount of current applied to the second organic EL element be smaller than an amount of current applied to the first organic EL element.

4. A display apparatus comprising:
    a first organic EL element and a second organic EL element respectively arranged in a first region and a second region that are same in color at least one of current output transistors for applying current to the first organic EL element and the second organic EL element;
    a capacitor connected to the at least one of current output transistor;
    a first switch element connected between the at least one of current output transistor and the first organic EL element;
    a second switch element connected between the current output transistor and the second organic EL element;
    a first selection control line switching ON/OFF of the first switch element, and
    a second selection control line switching ON/OFF of the second switch element, being different from the first selection control line,
    wherein a total thickness of layers which constitute the first organic EL element and a total thickness of layers which constitute the second organic EL element are different.

5. The display apparatus according to claim 4, wherein the at least one of current output transistor includes a first current output transistor to apply current to the first organic EL element and a second current output transistor to apply current to the second organic EL element, and the first switch element is connected between the first current output transistor and the first organic EL element, and the second switch element is connected between the second current output transistor and the second organic EL element.

6. The display apparatus according to claim 5, wherein a front luminance of the second region is higher than a front luminance of the first region, and a current supply capability of the first current output transistor and a current supply capability of the second current output transistor are different with each other so that an amount of current applied to the second organic EL element be smaller than an amount of current applied to the first organic EL element.

7. A display apparatus comprising:
  a first organic EL element and a second organic EL element respectively arranged in a first region and a second region that are same in color
  a light collecting lens arranged in the second region and not arranged in the first region;
  at least one of current output transistors for applying current to the first organic EL element and the second organic EL element;
  a capacitor connected to the at least one of current output transistor;
  a first power supply connected to the first organic EL element;
  a second power supply connected to the second organic EL element, being different from the first power supply, and
  a unit for independently switching potentials of the first power supply and the second power supply.

8. The display apparatus according to claim 7, wherein the at least one of current output transistor includes a first current output transistor for applying current to the first organic EL element and a second current output transistor for applying current to the second organic EL element.

9. The display apparatus according to claim 8, wherein a front luminance of the second region is higher than a front luminance of the first region, and a current supply capability of the first current output transistor and a current supply capability of the second current output transistor are different with each other so that an amount of current applied to the second organic EL element be smaller than an amount of current applied to the first organic EL element.

* * * * *